United States Patent
Lin

(10) Patent No.: US 12,148,778 B2
(45) Date of Patent: Nov. 19, 2024

(54) MICRO LENS ARRAYS AND METHODS OF FORMATION THEREOF

(71) Applicant: STMICROELECTRONICS LTD., Kowloon (HK)

(72) Inventor: Yu-Tsung Lin, Hsinchu (TW)

(73) Assignee: STMICROELECTRONICS LTD., Kowloon (HK)

( * ) Notice: Subject to any disclaimer, the term of this patent is extended or adjusted under 35 U.S.C. 154(b) by 248 days.

(21) Appl. No.: 17/243,195

(22) Filed: Apr. 28, 2021

(65) Prior Publication Data

US 2022/0352232 A1    Nov. 3, 2022

(51) Int. Cl.
| | |
|---|---|
| *H01L 27/146* | (2006.01) |
| *G02B 3/00* | (2006.01) |
| *G03F 7/00* | (2006.01) |

(52) U.S. Cl.
CPC ...... *H01L 27/14627* (2013.01); *G02B 3/0018* (2013.01); *G03F 7/0005* (2013.01); *H01L 27/14621* (2013.01); *H01L 27/14685* (2013.01)

(58) Field of Classification Search
CPC .. G02B 3/0018; G02B 3/0043; G02B 3/0006; G02B 3/0012; G03F 7/0005; H01L 27/14621; H01L 27/14685; H01L 27/14645; B29D 11/00019; B29D 11/00298
See application file for complete search history.

(56) References Cited

U.S. PATENT DOCUMENTS

| | | | |
|---|---|---|---|
| 7,812,302 B2 | 10/2010 | Kuo et al. | |
| 7,897,986 B2 | 3/2011 | Liu et al. | |
| 8,097,890 B2 | 1/2012 | Qian et al. | |
| 2005/0078377 A1 | 4/2005 | Li et al. | |
| 2006/0289956 A1 | 12/2006 | Boettiger et al. | |
| 2008/0274580 A1 | 11/2008 | Jung | |
| 2009/0034083 A1* | 2/2009 | Li | G02B 3/0031 |
| | | | 359/619 |
| 2009/0101952 A1 | 4/2009 | Park | |
| 2009/0146237 A1 | 6/2009 | Yun | |
| 2009/0200623 A1* | 8/2009 | Qian | G02B 3/0018 |
| | | | 257/E31.127 |
| 2011/0053309 A1* | 3/2011 | Hsieh | H01L 27/14627 |
| | | | 438/69 |
| 2011/0311919 A1 | 12/2011 | Yang et al. | |
| 2012/0043634 A1 | 2/2012 | Kurihara | |
| 2012/0104525 A1 | 5/2012 | Wu et al. | |
| 2012/0298842 A1 | 11/2012 | Arase et al. | |
| 2020/0348455 A1 | 11/2020 | Summa et al. | |

FOREIGN PATENT DOCUMENTS

KR    20110027738 A    3/2011

* cited by examiner

*Primary Examiner* — Nelson Garces
(74) *Attorney, Agent, or Firm* — Slater Matsil, LLP

(57) ABSTRACT

A method of forming a device, the method including: depositing a first photoresist layer over a substrate, forming an array of seed lenses by patterning and reflowing the first photoresist layer, a dimension of the array of seed lenses varying across the substrate, forming a second photoresist layer over the array of seed lenses, and forming a microlens array by patterning and reflowing the second photoresist layer.

20 Claims, 9 Drawing Sheets

Substrate Center — Substrate Edge

MICRO LENS ARRAYS AND METHODS OF FORMATION THEREOF

TECHNICAL FIELD

The present invention relates generally to optoelectronic devices, and, in particular embodiments, micro lens arrays and method of formation thereof.

BACKGROUND

Optoelectronic devices, such as complementary metal oxide semiconductor (CMOS) sensors include an array of pixels of image pickup elements. Typically, each pixel includes a photosensitive section such as a photodiode and may include non-light sensitive circuitry. When the optoelectronic devices is exposed to light, the light collected by the photosensitive sections receive photons and convert them into electric charge signals indicative of an output. On the other hand, the light exposed to the non-light sensitive circuitry is not collected and results in a reduced sensitivity.

Generally, as a technique to improve the light collection sensitivity without increasing the size of the photosensitive sections, a microlens array may be formed over the array of pixels. Each microlens of the array is associated with a corresponding pixel. Each microlens covers the photosensitive section and non-light sensitive areas of a pixel and focuses the light onto the photosensitive section causing the exposed light to converge (e.g. the focal point) onto the photosensitive sections.

In applications requiring the sensing of a color image, the array of pixels may further include color filters to capture the specific colors of the exposed light. Generally, the microlens, color filters, and photosensitive sections have their centers exactly aligned. In other words, they are substantially coaxial.

Traditionally, microlens arrays are formed by using a single lithographic process of forming a layer of photoresist over the layer of color filters, exposing the layer of photoresist to radiation through a patterned photomask, developing the photoresist layer to form a patterned resist layer, and heat treating the resist layer in a reflow step to partially reflow the patterned resist layer. Based on the viscosity of the photoresist, the resist layer forms the contour of the microlenses. Then, the resist layer is cooled to harden the resist, and thus, forms an array of microlenses.

However conventional microlens arrays come with their own sets of disadvantages. In non-telocentric optoelectronic devices such as cameras for mobile phones or imaging handsets, pixels at the center of the array receive light with a chief ray angle (CRA) of zero degrees. However, the CRA may increase from the center of the array to the edges of the array.

In other words light rays collected by the array increasingly deviate from vertical from center to edge. Generally each microlens has the same radius of curvature, and do not account for the changes in the CRA and an increasing optical path of the light rays. This may cause the focal point and the focal plane to change from the center of the array to the edges of the array causing a vertical shift of focus.

SUMMARY

In accordance with an embodiment of the invention, a method of forming a device includes depositing a first photoresist layer over a substrate, forming an array of seed lenses by patterning and reflowing the first photoresist layer, a dimension of the array of seed lenses varying across the substrate, forming a second photoresist layer over the array of seed lenses, and forming a microlens array by patterning and reflowing the second photoresist layer.

In accordance with another embodiment of the invention, a method of forming a device includes determining a chief ray angle for each photosensitive region of a device to be fabricated having a plurality of photosensitive regions, determining a focal length of a lens of a microlens array to be formed over each photosensitive region, determining a feature size of a photomask for forming a seed layer of the microlens array, and forming the microlens array, each lens of the microlens array having the focal length over the respective photosensitive region, the focal length varying from a center of the device to an edge of the device.

In accordance with another embodiment of the invention, a device includes a microlens array including an array of lenses, each of the array of lenses being configured to be positioned over a respective photosensitive section of a plurality of photosensitive sections of an optoelectronic device, and where dimensions of each of the array of lenses changes from a center of the microlens array to an edge of the microlens array, where each of the array of lenses includes a seed portion and a major lens portion covering the seed portion.

BRIEF DESCRIPTION OF THE DRAWINGS

For a more complete understanding of the present invention, and the advantages thereof, reference is now made to the following descriptions taken in conjunction with the accompanying drawings, in which:

FIGS. 1A-1B illustrate cross-sectional views of an optoelectronic device during various stages of fabrication in accordance with an embodiment of the present application, wherein FIG. 1A illustrates a cross-sectional view of the device after forming a microlens array on a substrate, and FIG. 1B illustrates a cross-sectional view of the device after the microlens array is attached over an array of color filters forming the optoelectronic device;

FIGS. 2A-2G illustrate cross-sectional views of an optoelectronic device during various stages of fabrication in accordance with an embodiment of the present application, wherein FIG. 2A illustrates the device after a first layer of photoresist is formed on a substrate, FIG. 2B the device after a first photomask is used to pattern the first layer of photoresist with a first photomask, FIG. 2C illustrates the device after the first plurality of segments are reflowed and form an array of seed lenses, FIG. 2D illustrates a cross-sectional view of the device after a second layer of photoresist is deposited over the array of seed lenses, FIG. 2E illustrates the device after the second layer of photoresist is exposed through a second photomask to form a second plurality of segments, FIG. 2F illustrates the substrate after the second plurality of segments are reflowed and form a microlens array, and FIG. 2G illustrates the device after the substrate is stripped and the microlens array is attached over an array of color filters;

FIGS. 5A-5F illustrate cross-sectional views of an optoelectronic device during various stages of fabrication in accordance with an embodiment of the present application, wherein FIG. 5A illustrates the device after a first layer of photoresist is formed on an array of color filters, FIG. 5B illustrates the device after the first layer of photoresist is patterned with a first plurality of segments using the first photomask, FIG. 5C illustrates the device after the first plurality of segments are reflowed and form an array of seed lenses, FIG. 5D illustrates the device after a second layer of photoresist is deposited over the array of seed lenses, FIG. 5E illustrates the device after the second layer of photoresist is exposed through a second photomask to form a second plurality of segments, and FIG. 5F illustrates the device after the second plurality of segments are reflowed and form a microlens array;

DETAILED DESCRIPTION OF ILLUSTRATIVE EMBODIMENTS

While microlens arrays have improved the sensitivity of pixels of optoelectronic devices such as complementary metal oxide semiconductor (CMOS) sensors, due to the equal size of each microlens, limitations still exist. Namely, light rays do not enter each microlens at a consistent chief ray angle (CRA). Specifically, the CRA and optical path of light increases from the center of the array to the edges of the array (i.e. deviates from vertical). This may cause the focal point (and focal plane) of each microlens to increase vertically and cause a vertical shift of focus. However, as devices are decreasing in size (e.g. becoming thinner and reducing in pixel size); the sensitivity of optoelectronic devices from center to edge is becoming increasingly worse.

Embodiments of this disclosure disclose forming a microlens array where the radius of convergence (ROC) of each microlens is optimized to account for the increasing CRA. More specifically, embodiments of the present invention relate to an optoelectronic device with an improved sensitivity that includes a microlens array comprising an array of lenses with changing radii of curvature (ROC) from the center to the edge of the device. In various embodiments, a method of forming an optoelectronic device includes forming an array of seed lenses of different sizes from the center to the edge of a substrate, and using them as a guide to form a microlens array.

Figure 1A:
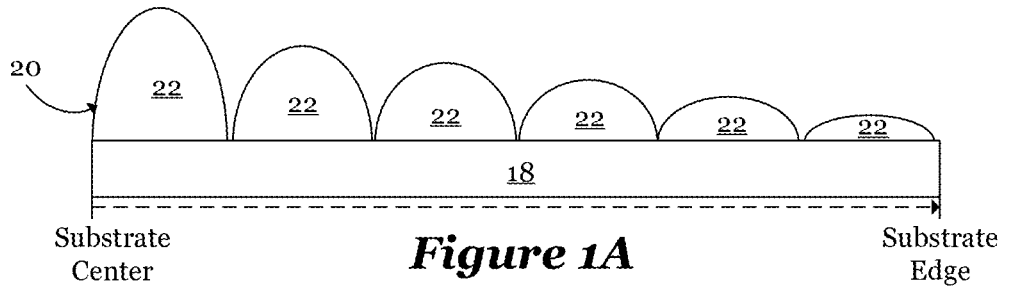
Figure 1B:
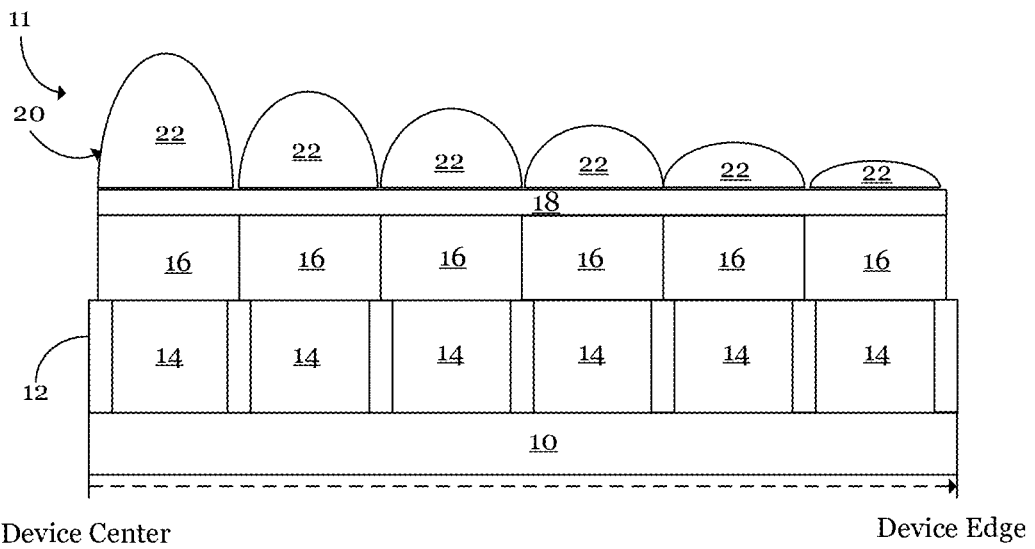

FIGS. 1A-1B illustrate cross-sectional views of an optoelectronic device during various stages of fabrication in accordance with an embodiment of the present application, wherein FIG. 1A illustrates a cross-sectional view of the device after forming a microlens array on a substrate, and FIG. 1B illustrates a cross-sectional view of the device after the microlens array is attached over an array of color filters forming the optoelectronic device.

FIG. 1A illustrates a schematic diagram of portion of a substrate from the center of the substrate to an edge of the substrate after forming a microlens array including lenses of changing radii of curvature (ROC).

Referring to FIG. 1A, a microlens array 20 may be formed over a substrate 18. In one or more embodiments, the substrate 18 may comprise silicon oxide, silicon, polymers including resins, ceramic substrates, quartz, glass, or any other substrate material known by one with ordinary skill in the art. The substrate 18 may include coatings/films including a metal layer such as chromium, titanium, aluminum, molybdenum, or dielectric layers such as oxide layer, nitride layer. If the substrate 18 is part of the final assembled device on the pixel array of the optoelectronic device, the substrate 18 is transparent with a low optical dispersion. However, in some embodiments, the substrate 18 is a carrier substrate that is removed after forming the lens array and only the lens array is mounted over the optoelectronic device.

In various embodiments, the microlens array 20 may include an array of lenses 22. In one or more embodiments, the lenses 22 may have a changing radius of curvature (ROC) from the center of the substrate 18 to the edge of the substrate 18. In other words, in one or more embodiments, the ROC of each lens 22 may increase from center to edge of the substrate 18 in order to improve the sensitivity of an optoelectronic device. In one or more embodiments, the lenses 22 consequently have a decreasing height from center to edge of the substrate 18. This will be discussed in more detail below.

In various embodiments, each lens 22 in the microlens array 20 may be configured to be aligned with a color filter and/or a photosensitive section (e.g., a pixel) of an optoelectronic device.

FIG. 1B illustrates a cross-sectional view of an optoelectronic device including the microlens array 20.

In various embodiments, the optoelectronic device 11 may include an array of color filters 16 that are formed over a plurality of photosensitive sections 14 which are formed over a semiconductor substrate win some embodiments, the optoelectronic device 11 may further include additional layers such as an insulating layer, a light shielding film, and a planarizing layer, or the like that are all formed between the photosensitive sections 14 and the semiconductor substrate 10.

In various embodiments, the semiconductor substrate 10 may be a bulk silicon substrate, silicon-on-insulator substrate, a silicon carbide substrate, a gallium arsenide substrate, or any other substrate, e.g., to form an optoelectronic device that is known by those with ordinary skill in the art.

In various embodiments, each photosensitive section 14 may comprise a photodiode such as a SPAD photodiode or any other light sensitive device having an array of light detectors known by those with ordinary skill in the art that may convert collected light into an electrical signal indicative of an output. For sake of clarity, this illustration does not show metallization and gate lines of transistors formed along with the photodiode as well as the specific structure of the photodiode.

Embodiments of the present application apply to both front side and back side illumination. In case of front side illumination, the microlens array 20 is separated from the photodiodes by the metallization while in case of back side illumination, the photodiode will be sandwiched between the metallization and the microlens array 20.

Each photosensitive section 14, i.e., pixel may be laterally isolated from its neighboring photosensitive section 14 by trench isolation regions 12, typically including semiconductor oxide, which extend throughout the thickness of the active layer (in this case the photosensitive section 14). Alternatively, the insulation between the pixels may be achieved by an over-doping (P-type) relative to the doping of the photosensitive section 14. The spacing between the trench isolation regions 12 defines the size of the pixels.

In various embodiments, the microlens array 20 may be attached to the array of color filters 16. In one or more embodiments, attaching the microlens array 20 may include stripping the substrate 18 and attaching it over the color filters 16 via a transparent adhesive layer. In various embodiments, the transparent adhesive layer may comprise a photoresist and/or high transmittance polymers, which can help to planarize the surface of the microlens array 20 while providing good adhesion between the color filters and the microlens array 20.

In one or more embodiments, each of the array of color filters 16 may be aligned to a respective photosensitive section 14. Each of the array of color filters 16 may be either a red, blue, or green color filter. The array of color filters 16 may be arranged to capture a specific color over each of the photosensitive sections 14. For example, the array of color filters 16 may be arranged in an alternating fashion, a Bayer array, or any other desired arrangement.

FIGS. 2A-2G illustrates stages of the process for forming an optoelectronic device with an improved sensitivity in which an array of microlenses is formed on a substrate. Then the substrate is attached over an array of color filters which are formed over a plurality of photosensitive sections that are formed over a semiconductor substrate.

Figure 2A:
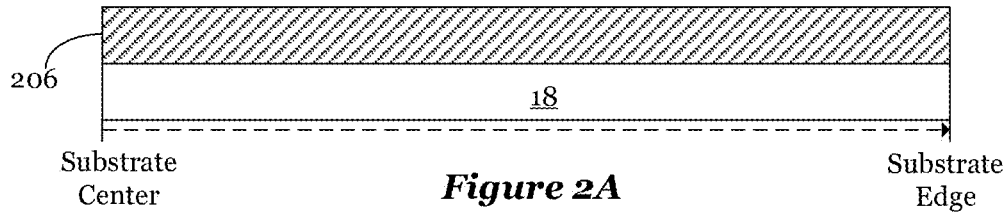
Figure 2B:
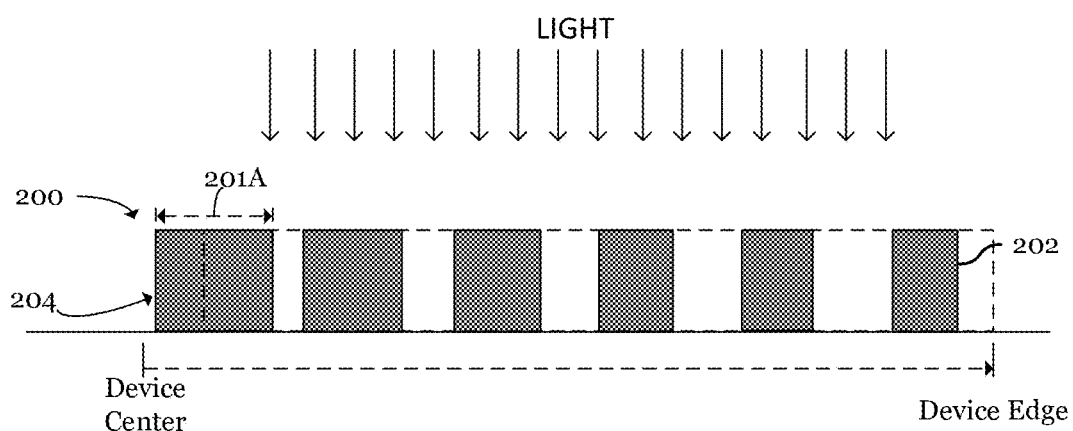
Figure 2C:
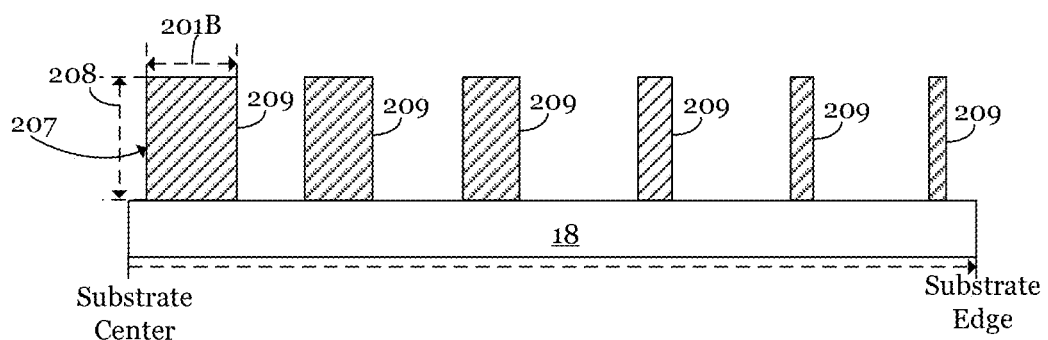
Figure 2C:
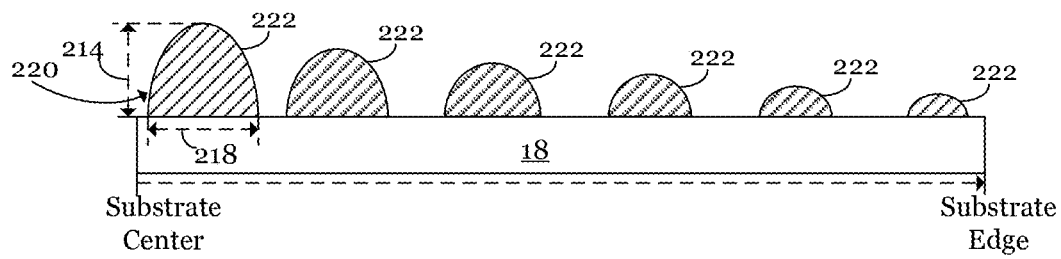
Figure 2D:
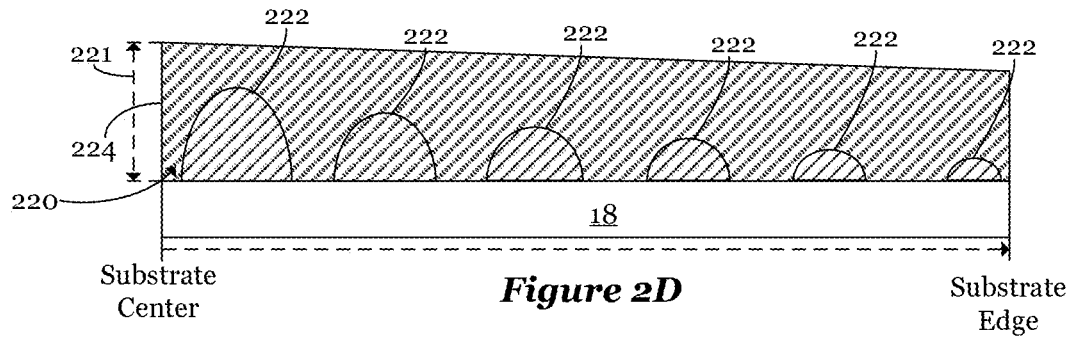
Figure 2E:
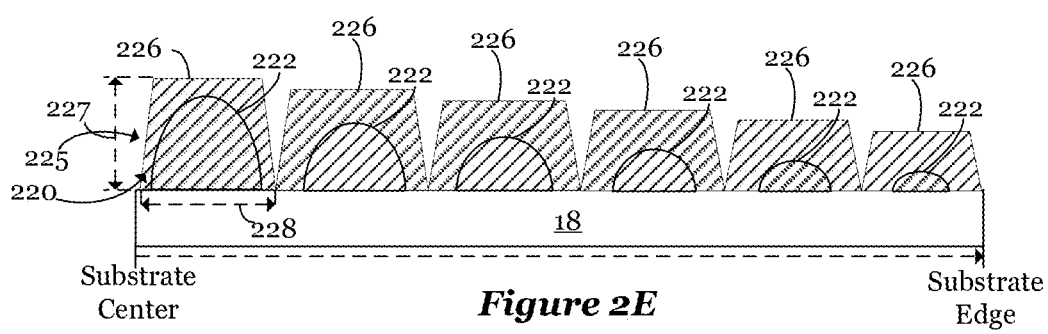
Figure 2F:
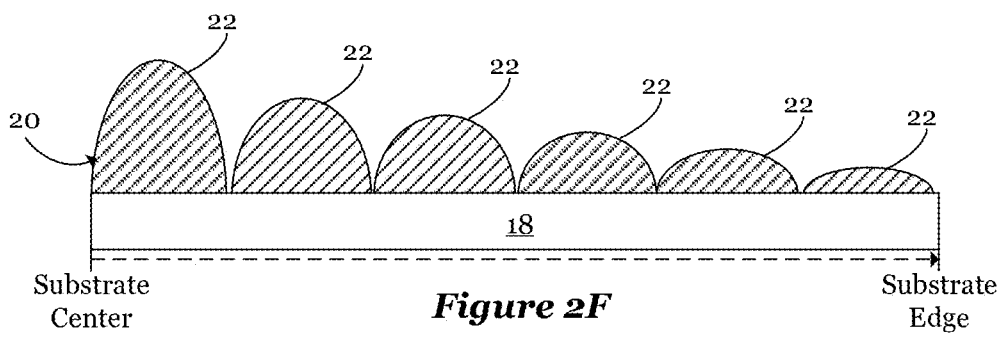
Figure 2G:
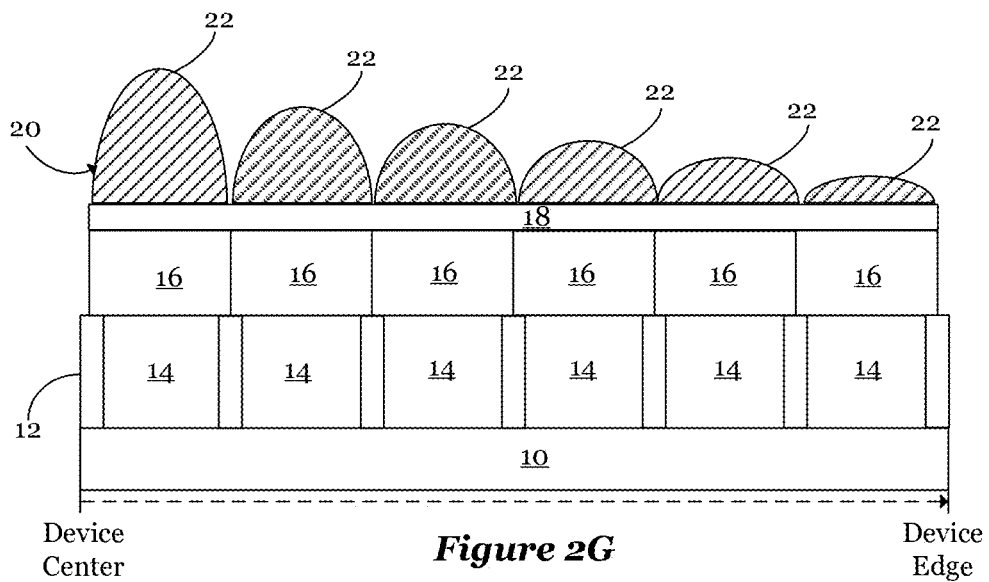
Figure 3:
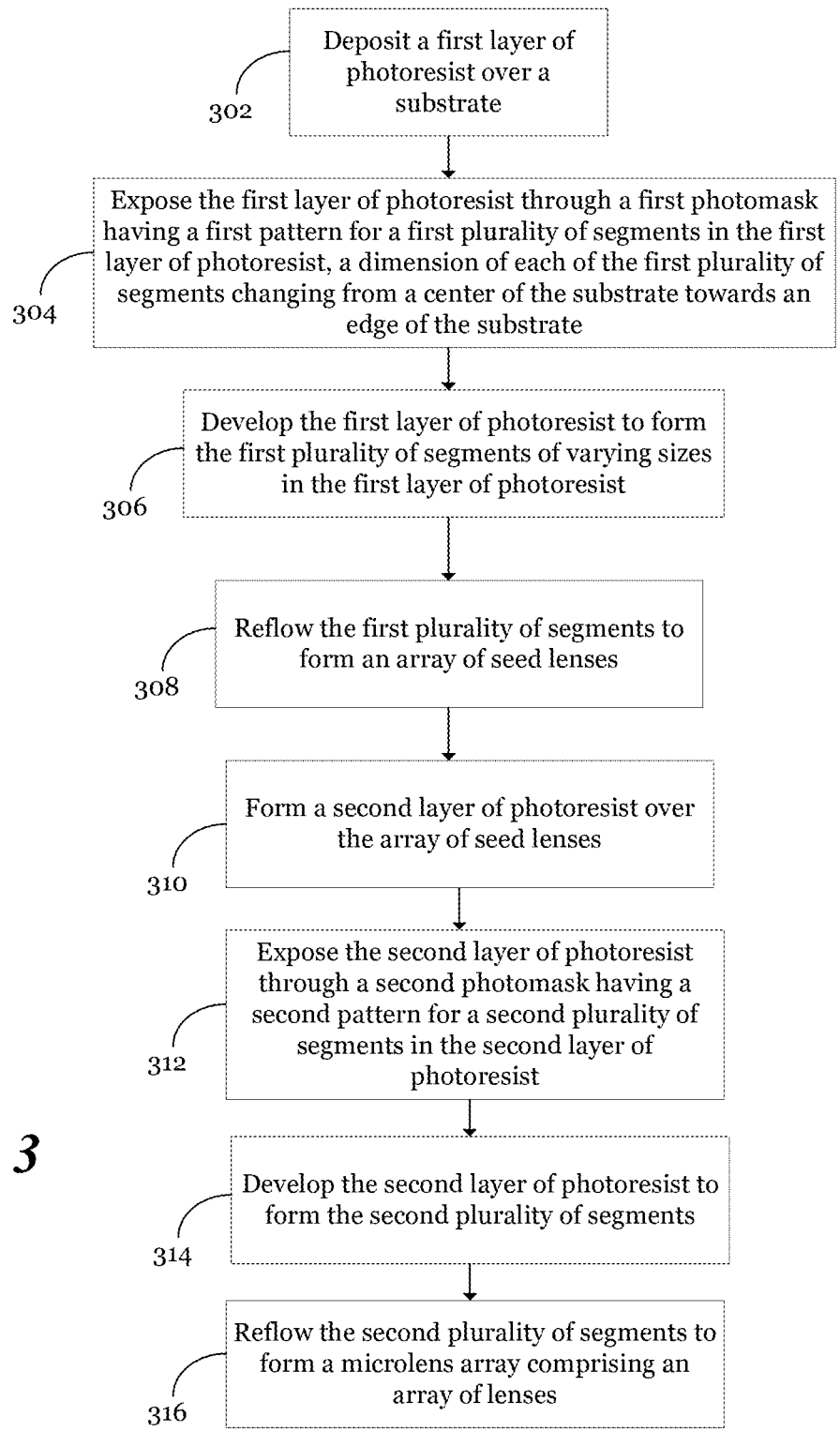
FIG. 3 is a flow chart corresponding to FIGS. 2A-2G and illustrates an example process flow of forming the optoelectronic device with an improved sensitivity.

FIGS. 2A-2G illustrate cross-sectional views of an optoelectronic device during various stages of fabrication in accordance with an embodiment of the present application, FIG. 2A illustrates the device after a first layer of photoresist is formed on a substrate, FIG. 2B the device after a first photomask is used to pattern the first layer of photoresist with a first photomask, FIG. 2C illustrates the device after the first plurality of segments are reflowed and form an array of seed lenses, FIG. 2D illustrates a cross-sectional view of the device after a second layer of photoresist is deposited over the array of seed lenses, FIG. 2E illustrates the device after the second layer of photoresist is exposed through a second photomask to form a second plurality of segments, FIG. 2F illustrates the substrate after the second plurality of segments are reflowed and form a microlens array, and FIG. 2G illustrates the device after the substrate is stripped and the microlens array is attached over an array of color filters. FIG. 3 is a flow chart corresponding to FIGS. 2A-2G and illustrates an example process flow of forming the optoelectronic device with an improved sensitivity.

For the purpose of providing an example, FIGS. 2A-2G may be described with reference to the structure of the optoelectronic devices of FIG. 1B. However the process steps described below may be used in conjunction with any optoelectronic device known in the art.

Referring to FIG. 2A, a first photoresist layer 206 is deposited over the substrate 18 (block 302 of FIG. 3). In various embodiments, the first photoresist layer 206 is selected to be transparent. In various embodiments, the first photoresist layer 206 is deposited by spin coating a first resist material over the substrate 18 and performing a soft-bake process to form a photoresist from the first resist material. In one or more embodiments, the first resist material may comprise a photoactive compound that is designed to interact with the light from the lithography process. For example, when the first resist material comprises diazonaphthoquinone positive photoresist, the photoactive compound forms carboxylic acid on exposure to UV light. In various embodiments, the photoresist formed from the first resist material may comprise acrylic, polyethylene, polymethylmethacrylate (PMMA), polyglycidolmonoethylether, or the like. The film thickness of the first photoresist layer 206 may depend on the design of the optoelectronic device such as whether front side or back side illumination is being used, the size and the number of pixels, and the like. In one or more embodiments, the first photoresist layer 206 may be deposited with a film thickness between 0.3 um and 0.5 µm, preferably 0.4 um.

Referring to FIG. 2B, a first patterned resist layer 207 comprising a first plurality of segments 209 may be formed in the first photoresist layer 206. In various embodiments, the first plurality of segments 209 may be formed in the first photoresist layer 206 by exposing the first photoresist layer 206 layer to light, e.g., ultraviolet (UV),through a first photomask 200, and developing the first photoresist layer 206 (blocks 304-306).

The first photomask 200 comprises a first pattern 204 having opaque areas 202 of decreasing in length 201A from the center of the device to be formed to the edge of the device to be formed. In an embodiment, the first photomask 200 is a binary mask but other types of masks may also be used in other embodiments. The first photomask 200 may be designed to form a microlens array for each device of a plurality of optoelectronic devices being formed and therefore the above illustrated pattern of the first photomask 200 may be duplicated or replicated across the entire first photomask 200.

Referring back to FIG. 1B, because the illustrated optoelectronic device ii comprises six color filters 16, the first plurality of segments 209 may comprise six segments. In various embodiments, each of the first plurality of segments 209 may be later aligned over a corresponding color filter 16. Although, the first plurality of segments 209 includes six segments, this is not indicative of the number of segments that may be formed.

In various embodiments, the volume of each segment of the first plurality of segments 209 may gradually decrease from center of the substrate 18 towards the edge of the substrate 18. Consequently, in various embodiments as discussed above, at least one of the feature length 201B and the feature width of the first plurality of segments 209 may decrease from center to edge of the substrate 18 based on the configuration of the first photomask 200. Advantageously, as described above, the dimensions of the first plurality of segments 209 are customizable.

Referring to the illustrated example of FIG. 2B, because the opaque areas 202 of the first photomask 200 decreased in length 201A, the width the feature length 201B of the first plurality of segments 209 may also decrease.

Although a photomask 200 is used to form the structure illustrated in FIG. 2B, embodiments of this application also envision other techniques including maskless processes such as printing to form the first plurality of segments 209. However, in all embodiments, changing the volume of individual segments of the first plurality of segments 209 by changing the length and/or width of the segments as opposed to the height enables a repeatable process having a process window that is amenable to high yield manufacturing.

Referring to FIG. 2C, an array of seed lenses 220 may be formed after a reflow anneal process. Referring back to FIG. 2C, because the first plurality of segments 209 comprised six segments, six seed lenses 222 may be formed. In various embodiments, the seed lenses 222 may be formed by reflowing the first plurality of segments (block 308). In one or more embodiments, reflowing may include heating the substrate 18 to a temperature between 80° C. and 200° C. for a time between 5 minutes and 20 minutes. Due to the viscosity of the first resist material, the first plurality of segments 209 reflow to form the contour of the seed lenses 222 during the reflow anneal. Then, upon cooling, the first plurality of segments 209 solidifies to form seed lens 222 with roughly a semi-spherical contour. The viscosity and surface tension at the reflow temperature may primarily influence the radius of curvature, i.e., focal length of the seed lens. During the reflow process, each of the first plurality of segments 209 reduces it surface energy by reducing the surface area by forming a semi-spherical contour. The radius of curvature of the array of seed lenses 220 may be thus optimized by changing the reflow anneal process.

In various embodiments, the dimensions of the seed lenses 222 such as the sagittal height 214 and the diameter 218 may progressively change from the center to the edge of the substrate 18 in accordance with the volume of the first plurality of segments 209. As understood by those with ordinary skill in the art, as the first plurality of segments 209 reflow, they decrease in height 208. Thus, each seed lens has a sagittal height 214 less than the height 208 of a corresponding first segment.

In various embodiments, due to the changing dimension of the first plurality of segments 209, the sagittal height 214 and diameter 218 of each seed lens 222 may progressively change from the center to the edge of the substrate 18. In one or more embodiments, the sagittal height 214 and diameter 218 of each seed lens 222 may progressively decrease from the center to the edge of the substrate 18.

Also, time/temperature of the reflow anneal process is controlled such that a segment having a larger volume will reflow less compared to a segment with a smaller volume. Thus, for a first plurality of segments 209 (FIG. 2B) having a larger volume (i.e., closer to the center of the substrate), the sagittal height 214 after reflow is almost similar to the height 208 (FIG. 2B) as well as the diameter 218 of a seed lens after reflow is almost similar to the feature length 201B (FIG. 2B). On the other hand, for a first plurality of segments 209 having a small volume (i.e., closer to the edge of the substrate), the sagittal height 214 after reflow is much smaller than the height 208 as well as the diameter 218 of a seed lens after reflow is much smaller than the feature length 201B.

As noted above, the amount of reflow of each of the first plurality of segments 209 may also be controlled by the process parameters of the reflow process. For example, increasing the reflow process time may increase the amount of reflow for each segment (or vice versa). In one or more embodiments, the increase in reflow may result in an increase in diameter 218 and a decrease in sagittal height 214 of each of the seed lenses (or vice versa). The reflow process parameters may be configured based on the size and composition (e.g. the composition of the first photoresist layer 206) of the first plurality of segments 209, and the desired dimensions of the seed lenses 222. Advantageously, this allows for the dimensions of each seed lens 222 to be optimized based on the configuration of the first photomask 200 and the process parameters of the reflow.

In various embodiments, the diameter 218 of the seed lenses may range between 0.1× and 1× of the feature length 201B, and the sagittal height 214 may range between 0.1× and 1× of the height 208. The lower limit is based on the resolution of the lithography system being used and may be different in other embodiments. In alternative embodiments, few pixels in the edge of the substrate 18 may not receive any first resist material and may not have any seed formation. Such regions may be formed with only the second layer of photoresist described further below.

Referring to FIG. 2D, a second photoresist layer 224 may be formed over the array of seed lenses 220 (block 310). In various embodiments, the second photoresist layer 224 may comprise the same resist material as the first photoresist layer 206, and therefore, the same material as the array of seed lenses 220. The second photoresist layer 224 may be formed in the same manner as the first photoresist layer 206.

As illustrated in FIG. 2D, the array of seed lenses 220 may be used as a guide pattern to control the formation of the second photoresist layer 224. In various embodiments, as the resist material is deposited over the substrate 18 it interacts with the dimensions of each of the seed lenses 222. In other words, since the deposition process tries to maintain a constant volume of the resist material across the substrate 18, the effective film thickness 221 of the second photoresist layer 224 (measured from the substrate 18) appears to decrease from the center to the edge of the substrate 18. The film thickness of the second photoresist layer 224 may depend on the design of the optoelectronic device such as whether front side or back side illumination is being used, the size and the number of pixels, and the like. In various embodiments, the film thickness 221 of the second photoresist layer 224 may be between 0.6 um and 0.8 um at the center of the substrate 18, and a minimum thickness at the edges of the substrate 18 between 0.4 um and 0.6 um.

Referring to FIG. 2E, a second patterned resist layer 225 comprising a second plurality of segments 226 may be formed with a second photomask. In various embodiments, the second plurality of segments 226 may be formed by exposing the second photoresist layer 224 to light through a second photomask, and developing the second photoresist layer 224 (blocks 312-314). The second photomask may be a binary mask in one embodiment and may be designed to form a plurality of microlenses that can be aligned with the corresponding color filters of an optoelectronic device. However, unlike the first photomask discussed above designed to introduce across device variations, the second photomask has no such feature to introduce across device variation. Therefore, the second photomask may have uniformly spaced features of equal sized opaque and transparent regions. In one or more embodiments, the patterns in the second photomask are designed so that the second plurality of segments 226 formed using the second photomask are aligned with each seed lens 222. As would be appreciated by one with ordinary skill in the art due to the non-planarity of the second layer of photoresist, the material removed during the second exposure may not result in segments having perfectly rectangular cross-sections.

In one or more embodiments, due to the changing effective film thickness 221 of the second photoresist layer 224 and the differing sizes of each of the seed lenses 222, the second plurality of segments 226 may have a different dimension. Referring back to FIG. 2E, each of the second plurality of segments 226 may decrease in height 227 due to the decreasing film thickness 221 of the second photoresist layer 224 from the center to the edge of the substrate 18.

Referring to FIG. 2F, the second plurality of segments 226 may undergo a reflow to form a microlens array 20 comprising an array of lenses 22 (block 316). In various embodiments, because the array of seed lenses 220 and the second photoresist layer 224 comprise the same material, each of the second plurality of segments 226 may merge into a respective seed lens 222. In one or more embodiments, the reflow may be performed in the same manner discussed in FIG. 2C above. However, compared to the prior reflow anneal of FIG. 2C, this reflow anneal may be performed over a longer time or at a higher temperature since the volume of material to be reflown is larger.

Advantageously, the processes parameters of the reflow process, the dimensions of the second plurality of segments 226, and the dimensions of the seed lenses 222 control the contour of each of the lenses. One advantage of this is that this allows control over the dimensions of each lens 22 and ensures the radius of curvature and therefore focal length of each lens 22 changes and is optimized from center to edge of the substrate 18. This results in lenses 22 with decreasing radius of curvature/focal length (increasing steepness) from center to edge of the substrate 18.

In other words, a microlens array 20 with optimized ROCs may be formed based on the configuration of first photomask 200 and the second photomask, and reflow process parameters for the two reflow anneals. In various embodiments, the first photomask 200 design and first reflow process for the first process may be independently controlled without changing the second photomask and second reflow process as will be further described in FIG. 4.

Referring to FIG. 2G, after forming the microlens array 20, the substrate 18 may be stripped from the microlens array 20 and the exposed surface of the microlens array 20 is attached over the array of color filters 16 of the optoelectronic device ii via a transparent adhesive layer. In one or more embodiments the transparent adhesive layer may comprise a photoresist and/or high transmittance polymers, which can help to planarize the surface of the microlens array 20 while providing good adhesion between the color filters 16 and the microlens array 20. In addition, in or more embodiments, one or both surfaces of the color filters 16 and the microlens array 20 may be pre-treated with an adhesion promoter such as Hexamethyldisilazane (HDMS) to enhance the adhesion between the array of color filers 16 and the microlens array 20. In other embodiments, the microlens array 20 may be formed directly onto the array of color filters 16 as will be described further below.

Figure 4A:
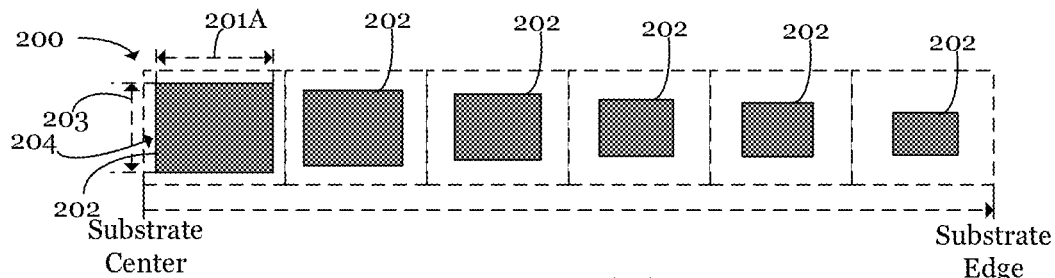
FIG. 4A includes an illustration of a top view of a first photomask used to form the seed lens in accordance with an embodiment of the present application.
Figure 4B:
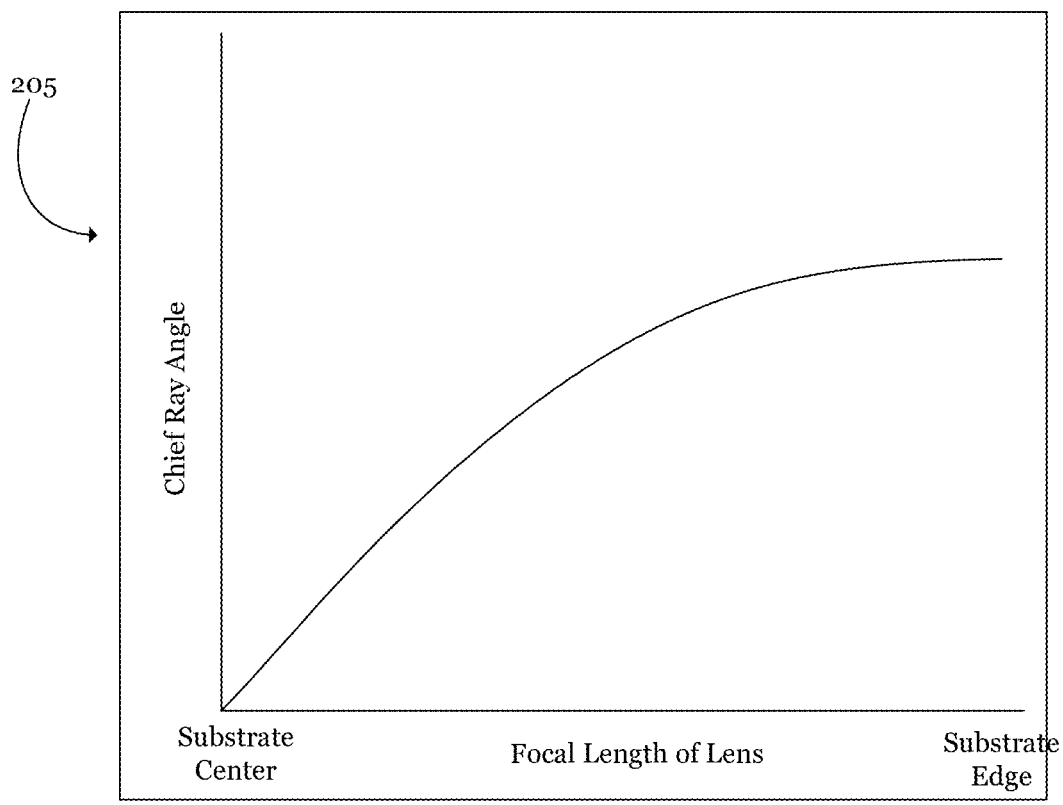
FIG. 4B illustrates a relationship between the chief ray angle and the focal length of lens for proper focus.
Figure 4C:
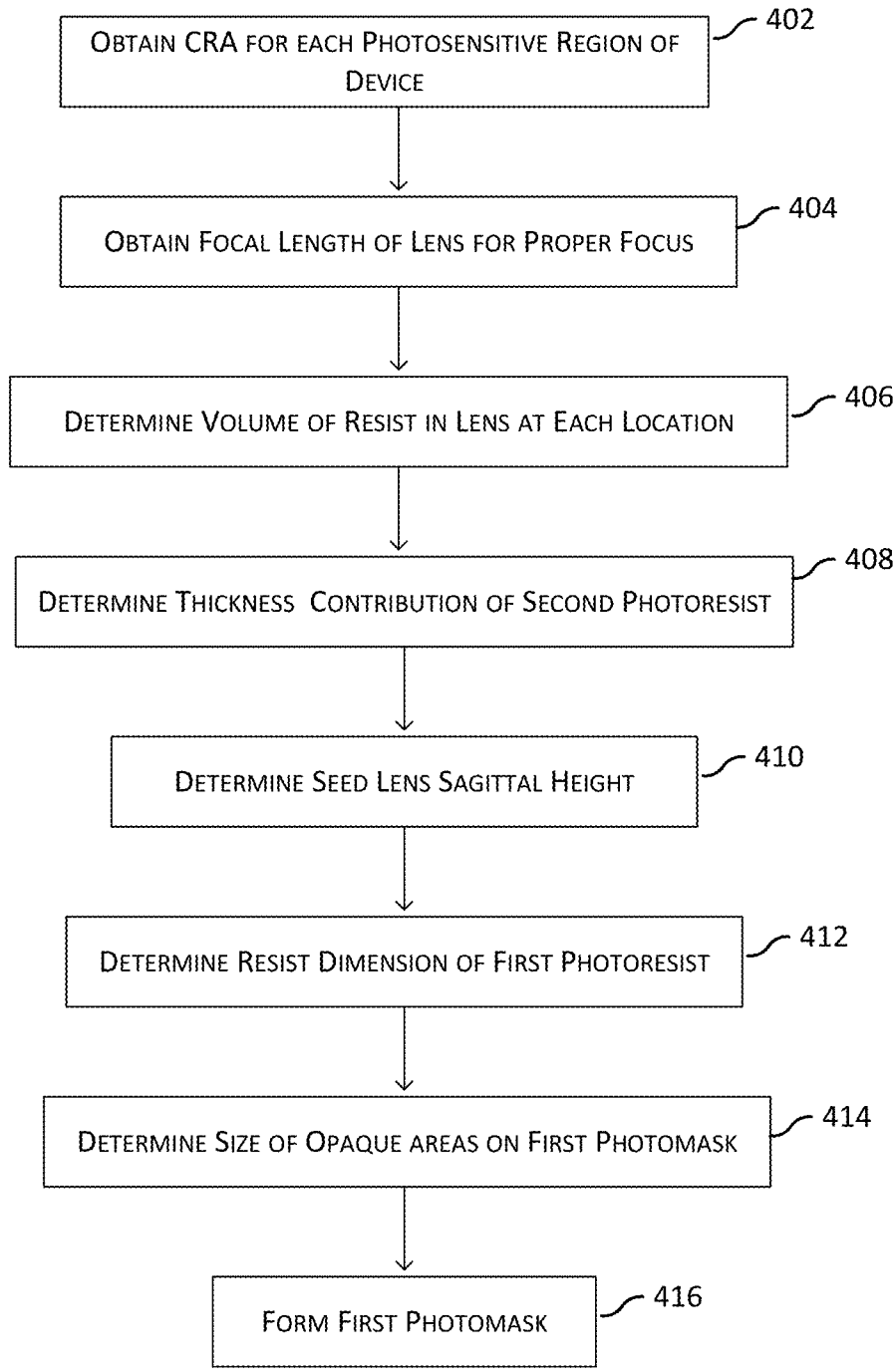
FIG. 4C illustrates a CRA shifting model used to form the first photomask in accordance with an embodiment of the present application.

FIG. 4A includes an illustration of a top view of a first photomask used to form the seed lens in accordance with an embodiment of the present application, FIG. 4B illustrates a relationship between the chief ray angle and the focal length of lens for proper focus, and FIG. 4C illustrates a CRA shifting model used to form the first photomask in accordance with an embodiment of the present application.

As previously described with respect to FIG. 2B, a first photomask 200 may be used to pattern a first layer of photoresist deposited onto the substrate 18 from the center of the substrate 18 to the edge of the substrate 18. In various embodiments, the first photomask 200 may comprise a substrate such as a quartz substrate with a first pattern 204 that may be used to form the first plurality of segments in the first layer of photoresist formed over the substrate 18 (FIG. 2B).

In other words, the first pattern 204 may be configured to selectively transmit/block light e.g., ultraviolet (UV) from regions of the first layer of photoresist. In one or more embodiments, the first pattern 204 may be formed such that a dimension of the first plurality of segments to be formed on the first layer of photoresist changes from the center towards the edge of the substrate 18. In various embodiments, the first photomask 200 may be aligned in a manner such that each of the first plurality of segments will be aligned with each color filter 16 and/or each photosensitive area 14.

In various embodiments, as mentioned above, the first plurality of segments may be sized and positioned to form seed lenses that will be used as a guide pattern to form lenses having optimal radii of curvature (ROC). Therefore, the first photomask 200 may be patterned and aligned based on the position of the color filters 16, the desired ROC of each lens, the tone of the first photoresist layer, and the process parameters of a subsequent reflow process.

As illustrated in FIG. 4A, the first pattern 204 may comprise a plurality of opaque areas 202. Referring back to FIG. 1A, because the optoelectronic device 11 comprises six photosensitive sections 14 it also comprises six color filters 16, and therefore, the first photomask 200 may comprise six opaque areas 202. Although, the first photomask 200 in FIG. 2A includes six opaque areas 202, this is not indicative of the number of opaque areas that may be included in the first photomask 200.

As understood by those with ordinary skill in the art, if the first layer of photoresist is a positive photoresist, the portions of the first layer of photoresist exposed to UV light become soluble to and removed by a developer. Therefore, as illustrated in FIG. 2A, if the first layer of photoresist is a positive tone photoresist, each opaque area 202 may comprise the cross-sectional shape and dimensions of an associated segment.

During operation, if the radius of curvature (ROC) of the lenses of the microlens array increases from center to edge, the focal length of each lens also increases from center to edge of the optoelectronic device 11. As understood by those with ordinary skill in the art, the less steep the curve of the outer surface of a microlens, the greater it's ROC, and the greater the ROC, the greater the focal length of the lens. Advantageously, the first pattern 204 may be configured to form a first plurality of segments with a dimension that decreases in size from center to edge of the substrate 18 according to a CRA shifting model.

In various embodiments, the length 201A and the width 203, of each of the opaque areas 202 may be configured to control the dimensions of the first plurality of segments. The opaque areas 202 may be chromium coated on the glass substrate as chromium is opaque to UV light. In other embodiments, the opaque areas 202 may be coated with other metals such as molybdenum. In one or more embodiments, the length 201A and the width 203 control the cross-sectional dimensions of the first plurality of segments.

In various embodiments, a CRA shifting algorithm may be used to generate the photomask 200 as further explained in relation to the graph in FIG. 4B and the flow chart of FIG. 4C.

Based on the device architecture, a chief ray angle (CRA) can be computed at each photosensitive location on the photodetector/optoelectronic device (block 402 in FIG. 4C). For example, the CRA may be computed for each photosensitive sections 14 on the photodetector/optoelectronic device. As illustrated in FIG. 4B, the CRA is zero at the center since the light source impinges the device surface vertically while the CRA increases towards to the edge of the substrate. The actual relationship between CRA and focal length would be dependent on several features including the device architecture. However, a fixed relationship between the chief ray angle (CRA) and the focal length of the lens in the optoelectronic device can be computed for any given architecture. For each CRA, a focal length that compensates the path difference can be obtained so that the light on the edge is at focus on/about the same focal plane as the light at the center of the device (block 404 in FIG. 4C).

Based on the focal length and the pitch between lenses in the microarray, the volume of resist in each lens in the microlens array to be formed can be computed (block 406 in FIG. 4C). The volume of resist is the final volume of the lens as for example illustrated in FIG. 2F-2G.

Based on experimental test data, the contribution of the second photoresist (e.g., formed in FIG. 2D) is determined (block 408 in FIG. 4C). For example, the volume of the second photoresist over each lens is about the same since the second photoresist has a uniform pattern unlike the first photoresist. Therefore, based on the spin-coating process to be used, the volume of the second photoresist over each lens is experimentally known.

The sagittal height of each seed lens to be formed can be next computed from the previously calculated volume of resist and volume of second photoresist (block 410). For example, the volume of second photoresist can be subtracted from the calculated volume of resist. In some embodiments, the sagittal height may not computed. Rather, the volume of resist in the seed lens needed may be sufficient to make an informed decision in the next steps.

Next, the dimensions of the resist of the first photoresist are determined (block 412). More specifically, for a given thickness of the first photoresist material to be deposited (e.g., first photoresist layer 206 in FIG. 2A), the dimensions of the resist can be determined based on the volume of resist in the seed lens at each location. For example, this may be based on assuming a square shape with a known thickness of the first photoresist.

As next illustrated in block 414, the pattern on the first photomask may be computed for a given lithographic system. The pattern on the first photomask, for example, may be obtained by scaling the dimensions of the resist obtained in block 412 with the scaling ratio of the lithographic system to be used. Accordingly, the size of the opaque areas 202 in the first photomask 200 may be determined as the pitch between adjacent opaque areas 202 is the same as the second photomask. In other words, the pitch between adjacent opaque areas 202 is determined to be the same as the second photomask to keep the seed lens aligned with the remaining portion of the resist that forms the lens 22.

As further illustrated in block 416, the first photomask may be fabricated according to the sizes of the opaque areas 202 and pitch determined above. In various embodiments, the first photomask may be formed by printing in various embodiments since the resolution of the features are not significantly miniaturized. Therefore, based on the CRA, the opaque areas 202 of the first photomask may be customized to accommodate satisfactory light transmission. Accordingly, as illustrated in FIG. 4A, the length 201A and the width 203 of the opaque areas 202 may be configured to decrease from the center to the edge of the substrate 18. In one or more embodiments this may result in a first plurality of segments with lengths and widths that decrease from center to edge of the substrate 18 while their heights remain constant.

Of course embodiments of the application apply to both positive and negative resists. If negative resists are used, the flow chart of FIG. 4C will be adjusted to reverse the calculations as known to a person skilled in the art. Particularly, the size of the opaque areas and transparent areas in the first photomask will be reversed.

Advantageously, embodiments of the present application allow the customization of the first photomask for a given design. One advantage of this is it allows for each lens of a microlens array to be formed having the optimal radius of curvature (ROC) of each lens.

Embodiments of the present application also contemplate situations in which the microlens array can be directly formed onto the optoelectronic device.

Figure 5A:
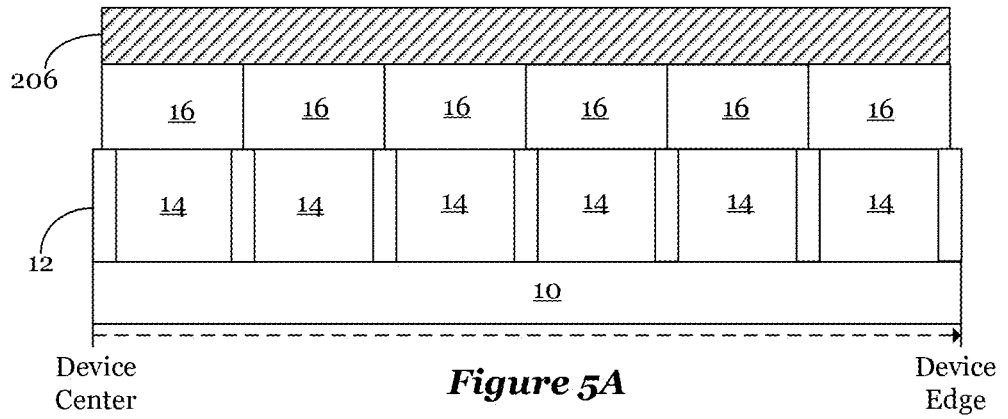
Figure 5B:
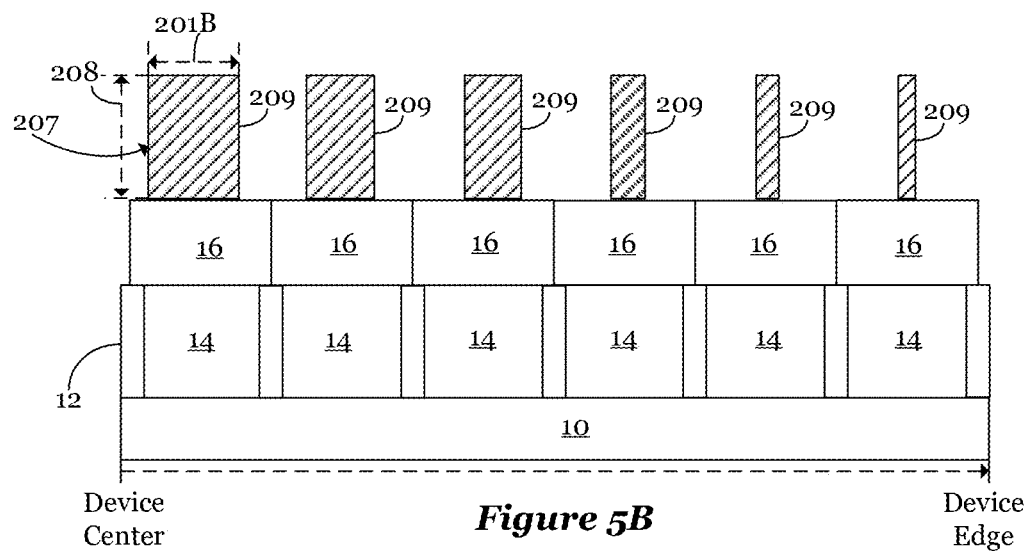
Figure 5C:
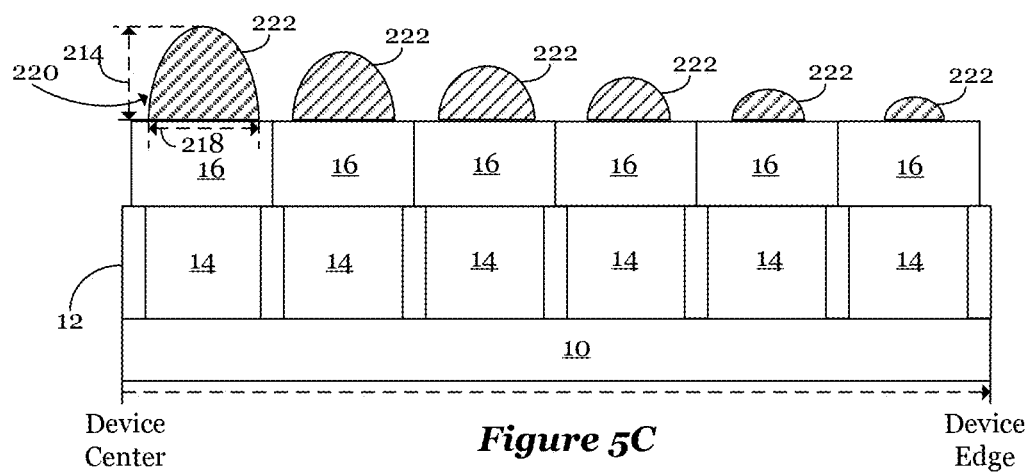
Figure 5D:
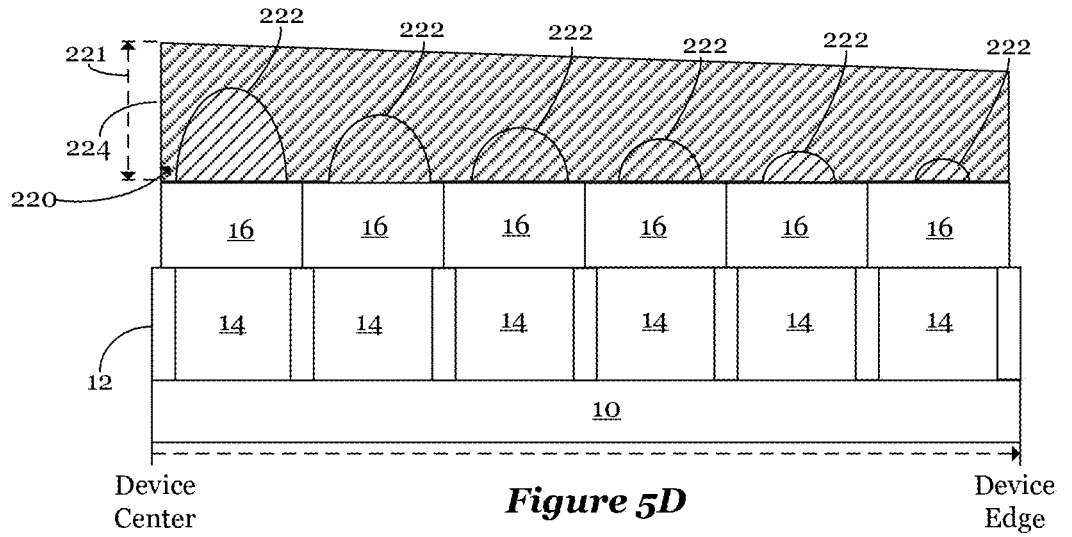
Figure 5E:
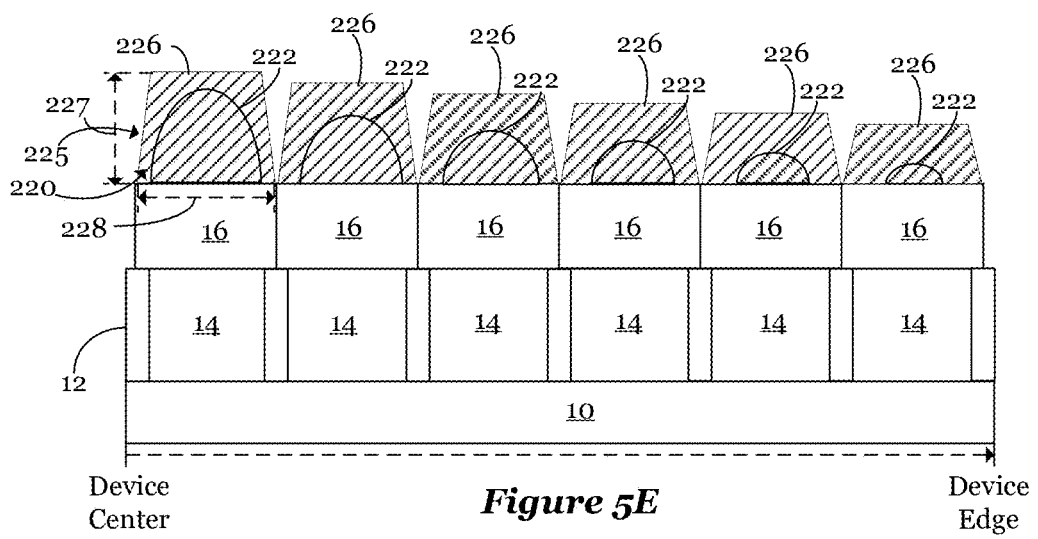
Figure 5F:
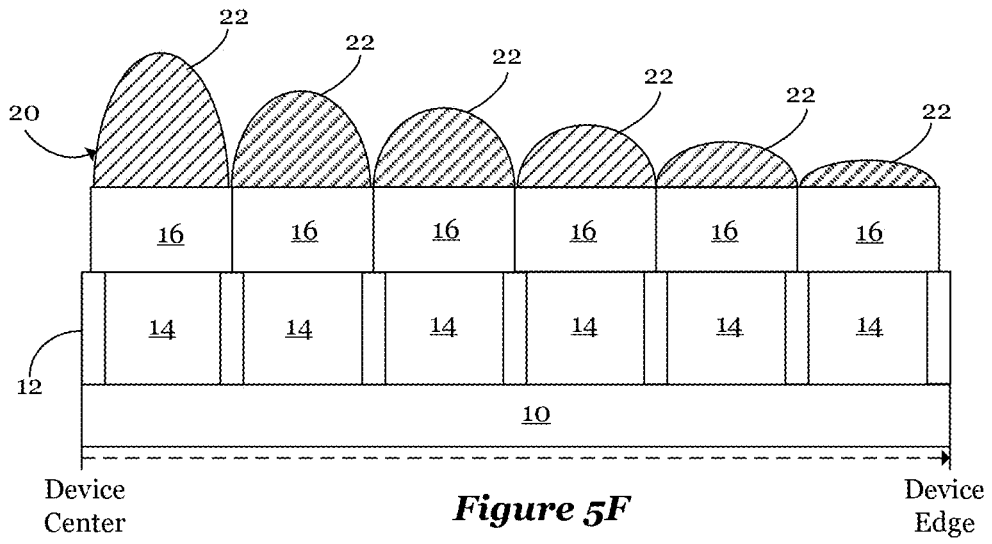

FIGS. 5A-5F illustrate cross-sectional views of an optoelectronic device during various stages of fabrication in accordance with an embodiment of the present application, FIG. 5A illustrates the device after a first layer of photoresist is formed on an array of color filters, FIG. 5B illustrates the device after the first layer of photoresist is patterned with a first plurality of segments using the first photomask, FIG. 5C illustrates the device after the first plurality of segments are reflowed and form an array of seed lenses, FIG. 5D illustrates the device after a second layer of photoresist is deposited over the array of seed lenses, FIG. 5E illustrates the device after the second layer of photoresist is exposed through a second photomask to form a second plurality of segments, and FIG. 5F illustrates the device after the second plurality of segments are reflowed and form a microlens array. Specific details of the process and materials are not described again for clarity while describing this embodiment as they follow the embodiment of FIGS. 2-3 described earlier.

As illustrated in FIG. 5A, the first photoresist layer 206 is deposited over the array of color filters 16. In general, a passivation layer such as silicon dioxide may cover the array of color filters 16 as well as the photosensitive regions 14. The passivation layer is optically transparent and protects the underlying devices. The first photoresist layer 206 may be deposited using a coating process including a spin-on process in various embodiments as described in the prior embodiments. Referring to FIG. 5B, the first patterned resist layer 207 comprising the first plurality of segments 209 may be formed in the first photoresist layer 206. The first patterned resist layer 207 may be formed by exposing the first photoresist layer 206 to light through the first photomask 200, which is formed as described in FIGS. 4A-4C. Referring to FIG. 5C, the array of seed lenses 220 may be formed. The array of seed lenses may be formed by reflowing the first plurality of segments 209. As illustrated in FIG. 5D, the second photoresist layer 224 may be formed over the array of seed lenses 220. As described above, the second photoresist layer 224 may be formed in the same manner of the first layer of photoresist. The second photoresist layer 224 may comprise the same material of a different material than the first photoresist layer 206. As illustrated in FIG. 5E, the second patterned resist layer 225 comprising the second plurality of segments 226 may be formed by exposing the second patterned resist layer 225 to light through a second etch mask Referring to FIG. 5F, the second plurality of segments 226 may undergo a reflow to form a microlens array 20 comprising an array of lenses 22 having optimized radii of convergence (ROCs).

Figure 6:
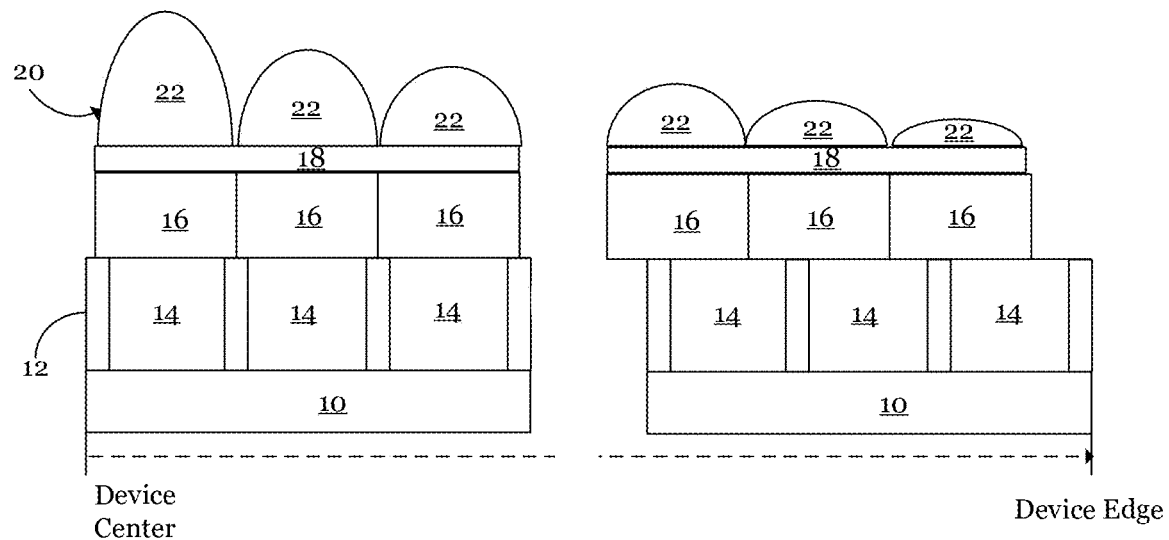
FIG. 6 illustrates a cross-sectional view of the optoelectronic device according to an embodiment of the present application.

FIG. 6 illustrates a cross-sectional view of the optoelectronic device according to an embodiment of the present application.

Embodiments of the present application also contemplate situations in which color filters on peripheral portions of the substrate may be shifted towards the center of the optoelectronic device. As illustrated in FIG. 6, the color filters 16 located on a peripheral portion of the optoelectronic device 11 may be misaligned (e.g. shifted towards the center of the device). Embodiments of the present application enable for the lenses to be shifted closer to the center of the device 11 to also account for the increased chief ray angle. In other words, as long as a pattern of misalignment of the color filters can be determined, a correction can be made so that these are incorporated into the first photomask. For example, this correction may be included while calculating the focal length of the lens needed at each location (block 404 of FIG. 4C).

Figure 7:
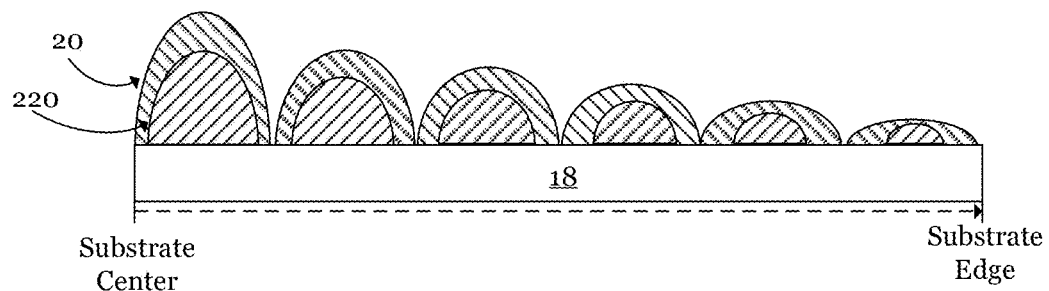
FIG. 7 illustrates a cross-sectional view of a microlens array comprising a first photoresist layer and a second photoresist layer according to an embodiment of the present application.

FIG. 7 illustrates a cross-sectional view of a microlens array according to an embodiment of the present application illustrating a first photoresist layer 206 and a second photoresist layer 224 forming a microlens array.

Generally, in various embodiments, the material of the first photoresist layer 206 and the material of the second photoresist layer 224 may be substantially similar materials. However, embodiments of the invention also contemplate situations in which the first photoresist layer 206 comprises a different material than the second photoresist layer 224. Therefore, the remaining material of the microlens array 20 and the array of seed lenses 220 may comprise different materials.

Advantageously, using two different resist materials may prevent intermixing of the materials of the first photoresist layer 206 and the second photoresist layer 224. One advantage of this may allow for the lenses 22 to more closely follow the contour of the seed lens array during reflow.

Example embodiments of the invention are summarized here. Other embodiments can also be understood from the entirety of the specification as well as the claims filed herein.

Example 1. A method of forming a device, the method including: depositing a first photoresist layer over a substrate; forming an array of seed lenses by patterning and reflowing the first photoresist layer, a dimension of the array of seed lenses varying across the substrate; forming a second photoresist layer over the array of seed lenses; and forming a microlens array by patterning and reflowing the second photoresist layer.

Example 2. The method of example 1, where forming the array of seed lenses includes forming a first plurality of segments of varying sizes in the first photoresist layer, a dimension of each of the first plurality of segments changing from a center of the substrate towards an edge of the substrate; and reflowing the first plurality of segments to form the array of seed lenses.

Example 3. The method of one of examples 1 or 2, where forming the microlens array includes patterning the second photoresist layer aligned with the array of seed lenses.

Example 4. The method of one of examples 1 to 3, where a radius of curvature of each seed lens progressively increases from a center of the substrate towards an edge of the substrate.

Example 5. The method of one of examples 1 to 4, where depositing the first photoresist layer over the substrate includes depositing the first photoresist layer over the substrate including an array of color filters disposed over a plurality of photosensitive sections, the first photoresist layer being formed over the array of color filters.

Example 6. The method of one of examples 1 to 5, further including attaching the microlens array to an optoelectronic device including a plurality of photosensitive sections and an array of color filters, and where each lens of the microlens array is positioned over each of the array of color filters and each of the plurality of photosensitive sections.

Example 7. The method of one of examples 1 to 6, where color filters of the array of color filters in a center portion of the optoelectronic device are aligned with a respective photosensitive section and color filters of the array of color filters in a peripheral region of the optoelectronic device are misaligned with a respective photosensitive section.

Example 8. The method of one of examples 1 to 7, further including compensating the misalignment of the array of color filters by varying a radius of curvature of each lens of the microlens array.

Example 9. The method of one of examples 1 to 8, where the first photoresist layer and the second layer of photoresist are made of a same photoresist material.

Example 10. The method of one of examples 1 to 9, where a radius of curvature of each lens of the microlens array increases from a center of the substrate to an edge of the substrate.

Example 11. The method of one of examples 1 to 10, where forming the array of seed lenses includes patterning the first photoresist layer with a first photomask, where forming the microlens array includes patterning the second photoresist layer with a second photomask, where the first photomask includes features of varying sizes, the second photomask includes features having a same size.

Example 12. A method of forming a device, the method including: determining a chief ray angle for each photosensitive region of a device to be fabricated having a plurality of photosensitive regions; determining a focal length of a lens of a microlens array to be formed over each photosensitive region; determining a feature size of a photomask for forming a seed layer of the microlens array; and forming the microlens array, each lens of the microlens array having the focal length over the respective photosensitive region, the focal length varying from a center of the device to an edge of the device.

Example 13. The method of example 12, where determining the feature size includes: determining a volume of resist for a lens of the microlens array at each photosensitive region based on the focal length; determining a volume contribution of a first photoresist layer and a second photoresist layer at each photosensitive region; determining a feature size of a first photoresist layer at each photosensitive region based on the volume contribution of a first photoresist layer; and determining feature size of a photomask at each photosensitive region based on the feature size of the first photoresist layer.

Example 14. The method of one of examples 12 or 13, further including: forming the photomask; forming the seed layer of the microlens array; and forming the microlens array over the seed layer.

Example 15. A device including: a microlens array including an array of lenses, each of the array of lenses being configured to be positioned over a respective photosensitive section of a plurality of photosensitive sections of an optoelectronic device, and where dimensions of each of the array of lenses changes from a center of the microlens array to an edge of the microlens array, where each of the array of lenses includes a seed portion and a major lens portion covering the seed portion.

Example 16. The device of example 15, where a sagittal height of each lens in the array of lenses progressively decreases from the center of the microlens array to the edge of the microlens array.

Example 17. The device of one of examples 15 or 16, further including: a semiconductor substrate including the plurality of photosensitive sections; and color filters disposed between the plurality of photosensitive sections and the array of lenses, where each of the array of lenses is positioned over each of the color filters.

Example 18. The device of one of examples 15 to 17, where the seed portion and the major lens portion include a different material.

Example 19. The device of one of examples 15 to 18, where a radius of curvature of each seed portion of the array of lenses increases from the center of the device to the edge of the device.

Example 20. The device of one of examples 15 to 19, where a radius of curvature of each of the array of lenses increases from the center of the device to the edge of the device.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of forming a device, the method comprising:
   depositing a first photoresist layer over a substrate;
   forming an array of seed lenses by patterning and reflowing the first photoresist layer, a dimension of the array of seed lenses varying across the substrate;
   forming a second photoresist layer over the array of seed lenses; and
   forming a microlens array by patterning and reflowing the second photoresist layer, a sagittal height of a seed lens in the array of seed lenses progressively decreasing from a center of the microlens array to an edge of the microlens array.

2. The method of claim 1, wherein forming the array of seed lenses comprises
   forming a first plurality of segments of varying sizes in the first photoresist layer, a dimension of each of the first plurality of segments changing from a center of the substrate towards an edge of the substrate; and
   reflowing the first plurality of segments to form the array of seed lenses.

3. The method of claim 1, wherein forming the microlens array comprises patterning the second photoresist layer aligned with the array of seed lenses.

4. The method of claim 1, wherein a radius of curvature of each seed lens progressively increases from a center of the substrate towards an edge of the substrate.

5. The method of claim 1, wherein depositing the first photoresist layer over the substrate comprises depositing the first photoresist layer over the substrate comprising an array of color filters disposed over a plurality of photosensitive sections, the first photoresist layer being formed over the array of color filters.

6. The method of claim 1, further comprising attaching the microlens array to an optoelectronic device comprising a plurality of photosensitive sections and an array of color filters, and wherein each lens of the microlens array is positioned over each of the array of color filters and each of the plurality of photosensitive sections.

7. The method of claim 6, wherein color filters of the array of color filters in a center portion of the optoelectronic device are aligned with a respective photosensitive section and color filters of the array of color filters in a peripheral region of the optoelectronic device are misaligned with a respective photosensitive section.

8. The method of claim 7, further comprising compensating the misalignment of the array of color filters by varying a radius of curvature of each lens of the microlens array.

9. The method of claim 1, wherein the first photoresist layer and the second photoresist layer are made of a same photoresist material.

10. The method of claim 1, wherein a radius of curvature of each lens of the microlens array increases from a center of the substrate to an edge of the substrate.

11. The method of claim 1, wherein forming the array of seed lenses comprises patterning the first photoresist layer with a first photomask, wherein forming the microlens array comprises patterning the second photoresist layer with a second photomask, wherein the first photomask comprises features of varying sizes, the second photomask comprises features having a same size.

12. A method of forming a device, the method comprising:
   determining a chief ray angle for each photosensitive region of a device to be fabricated having a plurality of photosensitive regions;
   determining a focal length of a lens of a microlens array to be formed over each photosensitive region;
   determining a feature size of a photomask to pattern a photoresist layer for forming a seed layer of the microlens array;
   forming the microlens array by patterning and reflowing the photoresist layer, each lens of the microlens array having a sagittal height progressively decreasing from a center of the device to an edge of the device;
   determining a volume of resist for a lens of the microlens array at each photosensitive region based on the focal length,
   determining a volume contribution of a first photoresist layer and a second photoresist layer at each photosensitive region;
   determining a feature size of the first photoresist layer at each photosensitive region based on the volume contribution of the first photoresist layer; and
   determining a feature size of a photomask at each photosensitive region based on the feature size of the first photoresist layer.

13. The method of claim 12, further comprising:
   forming the photomask;
   forming the seed layer of the microlens array; and
   forming the microlens array over the seed layer.

14. A method of forming a device, the method comprising:
   depositing a first photoresist layer over a substrate;
   forming an array of seed lenses by patterning and reflowing the first photoresist layer, a dimension of the array of seed lenses varying across the substrate;
   forming a second photoresist layer over the array of seed lenses; and
   forming a microlens array by patterning and reflowing the second photoresist layer;
   after forming the microlens array, stripping the substrate from the microlens array to expose a surface of the microlens array; and
   attaching an array of color filters to the exposed surface of the microlens array.

15. The method of claim 14, wherein the array of color filters is attached to the microlens array via a transparent adhesive layer.

16. The method of claim 14, further comprising pretreating the exposed surface of the microlens array with an adhesion promoter before the attaching.

17. The method of claim 14, wherein the first photoresist layer and the second photoresist layer are made of a same photoresist material.

18. The method of claim 14, wherein forming the microlens array comprises patterning the second photoresist layer aligned with the array of seed lenses.

19. The method of claim 14, wherein a radius of curvature of each seed lens progressively increases from a center of the substrate towards an edge of the substrate.

20. The method of claim 14, further comprising compensating the misalignment of the array of color filters by varying a radius of curvature of each lens of the microlens array.

* * * * *